US011212950B2

(12) United States Patent
Takehara et al.

(10) Patent No.: US 11,212,950 B2
(45) Date of Patent: Dec. 28, 2021

(54) SUPPORT PIN ARRANGEMENT DETERMINATION ASSISTING APPARATUS

(71) Applicant: Panasonic Intellectual Property Management Co., Ltd., Osaka (JP)

(72) Inventors: Hirokazu Takehara, Fukuoka (JP); Takaaki Yokoi, Fukuoka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 187 days.

(21) Appl. No.: 16/244,673

(22) Filed: Jan. 10, 2019

(65) Prior Publication Data

US 2019/0150333 A1    May 16, 2019

Related U.S. Application Data

(62) Division of application No. 14/764,096, filed as application No. PCT/JP2014/000466 on Jan. 29, 2014, now Pat. No. 10,219,419.

(30) Foreign Application Priority Data

Jan. 30, 2013  (JP) .................................. 2013-015079
Jan. 30, 2013  (JP) .................................. 2013-015080
Jan. 31, 2013  (JP) .................................. 2013-016523

(51) Int. Cl.
*H05K 13/00* (2006.01)
*H05K 13/08* (2006.01)
(Continued)

(52) U.S. Cl.
CPC ......... *H05K 13/0069* (2013.01); *G06F 30/00* (2020.01); *G06T 11/60* (2013.01);
(Continued)

(58) Field of Classification Search
CPC ..... G06F 30/00; G06T 11/60; H05K 13/0061; H05K 13/0069; H05K 13/08
See application file for complete search history.

(56) References Cited

U.S. PATENT DOCUMENTS 5,794,329 A    8/1998  Rossmeisl et al.
6,049,740 A    4/2000  Whitehead et al.
(Continued)

FOREIGN PATENT DOCUMENTS

CN    1619792 A    5/2005
CN    1681382 A    10/2005
(Continued)

OTHER PUBLICATIONS

International Search Report for Application No. PCT/JP2014/000466 dated May 13, 2014.
(Continued)

*Primary Examiner* — Minh N Trinh
(74) *Attorney, Agent, or Firm* — Pearne & Gordon LLP

(57) ABSTRACT

A support pin arrangement determination assisting apparatus including a display unit which displays an image including a board image, the board image indicating a shape and an arrangement of a component on the board, a position input unit through which an arrangement position of the support pin is input, a display processing unit which causes the display unit to display a figure to be superimposed on the board image, the figure corresponding to the support pin of which the arrangement position is input, a storage unit which stores three-dimensional shape data of an electronic component and three-dimensional shape data of the support pin, an interference judging unit which judges whether or not one or some of the support pins of which arrangement positions input interfere an already mounted component, and an alarm unit which announces occurrence of interference if the
(Continued)

interference judging unit judges the occurrence of interference.

18 Claims, 12 Drawing Sheets

(51) Int. Cl.
 *G06F 30/00* (2020.01)
 *G06T 11/60* (2006.01)
(52) U.S. Cl.
 CPC ......... *H05K 13/0061* (2013.01); *H05K 13/08* (2013.01); *Y10T 29/49119* (2015.01); *Y10T 29/53174* (2015.01); *Y10T 29/53191* (2015.01)

(56) References Cited

U.S. PATENT DOCUMENTS

| | | | |
|---|---|---|---|
| 6,212,751 B1 | 4/2001 | Hattori | |
| 6,434,264 B1 | 8/2002 | Asar | |
| 8,661,657 B2 | 3/2014 | Ito et al. | |
| 10,219,419 B2* | 2/2019 | Takehara | G06T 11/60 |
| 2003/0106207 A1 | 6/2003 | Terui | |
| 2004/0255455 A1 | 12/2004 | Yu et al. | |
| 2006/0265865 A1 | 11/2006 | Yoshida | |
| 2007/0073428 A1 | 3/2007 | Oohasi et al. | |
| 2007/0218737 A1 | 9/2007 | Suhara | |
| 2011/0037694 A1* | 2/2011 | Juen | G06F 3/04845 345/157 |
| 2011/0268346 A1 | 11/2011 | Ito et al. | |
| 2013/0276281 A1 | 10/2013 | Yamashita et al. | |
| 2015/0363957 A1* | 12/2015 | Takehara | H05K 13/08 345/629 |
| 2015/0373884 A1* | 12/2015 | Takehara | H05K 13/0061 29/825 |
| 2019/0150333 A1* | 5/2019 | Takehara | G06T 11/60 29/825 |

FOREIGN PATENT DOCUMENTS

| | | | |
|---|---|---|---|
| CN | 1784941 A | 6/2006 | |
| CN | 1871885 A | 11/2006 | |
| CN | 102238862 A | 11/2011 | |
| JP | H04-359600 A | 12/1992 | |
| JP | H08-279695 A | 10/1996 | |
| JP | 2000-323897 A | 11/2000 | |
| JP | 2003-188599 A | 7/2003 | |
| JP | 2003-204198 A | 7/2003 | |
| JP | 2004-140161 A | 5/2004 | |
| JP | 2004-335973 A | 11/2004 | |
| JP | 3992486 B2 | 10/2007 | |
| JP | 2008-124508 A | 5/2008 | |
| JP | 2008-211051 A | 9/2008 | |
| JP | 4337622 B2 | 9/2009 | |
| JP | 4452686 B2 | 4/2010 | |
| JP | 2010-171149 A | 8/2010 | |
| JP | 4572262 B2 | 11/2010 | |
| JP | 2012-138606 A | 7/2012 | |
| JP | 2013-120765 A | 6/2013 | |
| WO | 96-26809 A1 | 9/1996 | |

OTHER PUBLICATIONS

ASM Assembly Systems Gmbh & CO., KG, "SIPLACE Smart Pin Support", brochure, Jan. 2013, Munich, Germany.
Chinese Office Action issued in Patent Application No. 201480006246.8 dated Apr. 25, 2017.
Chinese Office Action issued in Patent Application No. 201480006246.8 dated Sep. 28, 2017.
Chinese Office Action issued in Patent Application No. 201480006544.7 dated May 16, 2017.
International Search Report issued in Patent Application No. PCT/JP2014/000466 dated May 13, 2014.
International Search Report issued in Patent Application No. PCT/JP2014/000467 dated May 13, 2014.
International Search Report issued in Patent Application No. PCT/JP2014/000468 dated May 13, 2014.
Japanese Office Action issued in Patent Application No. 2013-016523 dated Sep. 8, 2015.
United States Office Action issued in U.S. Appl. No. 14/764,096 dated Feb. 8, 2018.
United States Office Action issued in U.S. Appl. No. 14/764,096 dated Sep. 8, 2017.
United States Office Action issued in U.S. Appl. No. 14/764,192 dated Oct. 3, 2016.
United States Office Action issued in U.S. Appl. No. 14/764,296 dated Sep. 11, 2017.
English Translation of Written Opinion issued in Patent Application No. PCT/JP2014/000466 dated May 13, 2014.
English Translation of Written Opinion issued in Patent Application No. PCT/JP2014/000467 dated May 13, 2014.
English Translation of Written Opinion issued in Patent Application No. PCT/JP2014/000468 dated May 13, 2014.

* cited by examiner

SUPPORT PIN ARRANGEMENT DETERMINATION ASSISTING APPARATUS

CROSS-REFERENCE TO RELATED APPLICATIONS

This is a division of U.S. patent application Ser. No. 14/764,096 Filed Jul. 28, 2015 and patented as U.S. Pat. No. 10,219,419 issued Feb. 26, 2019, which is the national phase of PCT/JP2014/000466 filed Jan. 29, 2014, which claims the benefit of Japanese Patent Application No. 2013-015079 filed Jan. 30, 2013, and Japanese Patent Application No. 2013-015080, filed Jan. 30, 2013, and Japanese Patent Application No. 2013-016523, filed Jan. 31, 2013, each of which is incorporated herein by reference in its entirety.

FIELD

The present invention relates to a support pin arrangement determination assisting apparatus and support pin arrangement determination assisting method, for assisting the determination of an arrangement of support a pin that supports a board in an electronic component mounting machine.

BACKGROUND

Support pin methods in which a board is supported by bringing plural support pins into contact with a lower surface are employed widely as board support methods for supporting a board from a lower side in component mounting processes of mounting electronic components on a board. In such support pin methods, in the case where there are already mounted components that have already been mounted on the lower side of a board in a preceding process, it is necessary to determine an arrangement of support pins by selecting locations that enable supporting (supportable positions) without causing positional interference with the already mounted components. The determination of an arrangement of support pins is done in such a manner that an operator observes the arrangement of electronic components on an already mounted surface at a manufacturing site and thereby finds supportable locations. Various kinds of assisting apparatus have come to be employed to facilitate this pin arrangement work (refer to Patent Document 1, for example). In the related art technique disclosed in this Patent Document, an image of an already mounted surface and an image indicating the arrangement of pin holes where support pins are disposed are displayed in superimposition to enable a visual check as to occurrence/non-occurrence of interference between the support pins and the already mounted components.

Related Art Documents

Patent Documents

Patent Document 1: JP-A-2008-211051

SUMMARY OF THE INVENTION

Problem to be Solved by the Invention

In recent years, with the increase of mounting densities due to the miniaturization of electronic apparatus, it have become necessary to set an arrangement of support pins for a mounting board more precisely. However, the related art including the technique disclosed in the above-mentioned Patent Document merely shows two-dimensional positions of support pins on an already mounted surface. It is therefore difficult to recognize the details of a portion where a tip portion of each support pin contacts a board. As a result, in a case in which a high mounting density board that imposes strict restrictions on supportable locations is to be dealt with, it takes time and labor to check occurrence/non-occurrence of interference in work of determining an arrangement of support pins. Therefore, there is a need of development of an assisting function which can provide more precise judgment on occurrence/non-occurrence of interference between support pins and already mounted components.

In view of the above, an object of the present invention is to provide a support pin arrangement determination assisting apparatus and a support pin arrangement determination assisting method which can judge occurrence/non-occurrence of interference between a support pin and an already mounted component more precisely in work of determining an arrangement of support pin for a high mounting density board.

Means for Solving the Problem

According to the present invention, there is provided a support pin arrangement determination assisting apparatus which assists determination of an arrangement of a support pin that supports an already mounted surface of a board from a lower side in a board holding unit of an electronic component mounting machine, the support pin arrangement determination assisting apparatus including: display means which displays an image including a board image that indicates a shape and an arrangement of an already mounted component on the already mounted surface; a position input unit through which an arrangement position of the support pin is input to the displayed image; and a pin image display processing unit which causes the display means to display a composite image in which a pin arrangement image indicating the input arrangement position is superimposed on the board image, wherein a planar image of the support pin in the pin arrangement image includes an image of a top portion of a shaft erected in the board holding unit and an image of a contact portion which is located on a tip side of the top portion, which has a sectional shape smaller than that of the top portion, and which contacts and supports a lower surface of the board.

According to the present invention, there is provided a support pin arrangement determination assisting method for assisting the determination of an arrangement of a support pin that supports an already mounted surface of a board from a lower side in a board holding unit of an electronic component mounting machine, the support pin arrangement determination assisting method including: a display step of displaying an image including a board image that indicates a shape and an arrangement of an already mounted component on the already mounted surface; a position input step of inputting an arrangement position of the support pin to the displayed image; and a pin image display processing step of causing display means to display a composite image in which a pin arrangement image indicating the input arrangement position is superimposed on the board image, wherein a planar image of the support pin in the pin arrangement image includes an image of a top portion of a shaft erected in the board holding unit and an image of a contact portion which is located on a tip side of the top portion, which has a sectional shape smaller than that of the top portion, and which contacts and supports a lower surface of the board.

Advantages of the Invention

According to the invention, in determining an arrangement of the support pin for supporting the already mounted surface of a board from the lower side in the board holding unit, the image including the board image indicating shapes and an arrangement of an already mounted component on the already mounted surface is displayed, the arrangement position of the support pin is input to the displayed image, and the composite image in which a pin arrangement image indicating the input arrangement position is superimposed on the board image is displayed. The planar image of the support pin in the pin arrangement image is made to include the image of the contact portion which has a sectional shape smaller than that of the shaft and which contacts and supports the lower side of the board. As a result, in support pin arrangement determining work for a high mounting density board, occurrence/non-occurrence of interference between the support pin and the already mounted component can be judged more precisely.

MODE FOR CARRYING OUT THE INVENTION

Next, an embodiment of the present invention will be described with reference to the drawings. First, the overall configuration of an electronic component mounting machine 1 will be described with reference to FIG. 1. The electronic component mounting machine 1 has a function of holding an electronic component with an absorption nozzle that is attached to a mounting head and mounting it on a board, and constitutes an electronic component mounting system together with a host system 15 and other machines connected to it via a communication network 16.

Figure 1:
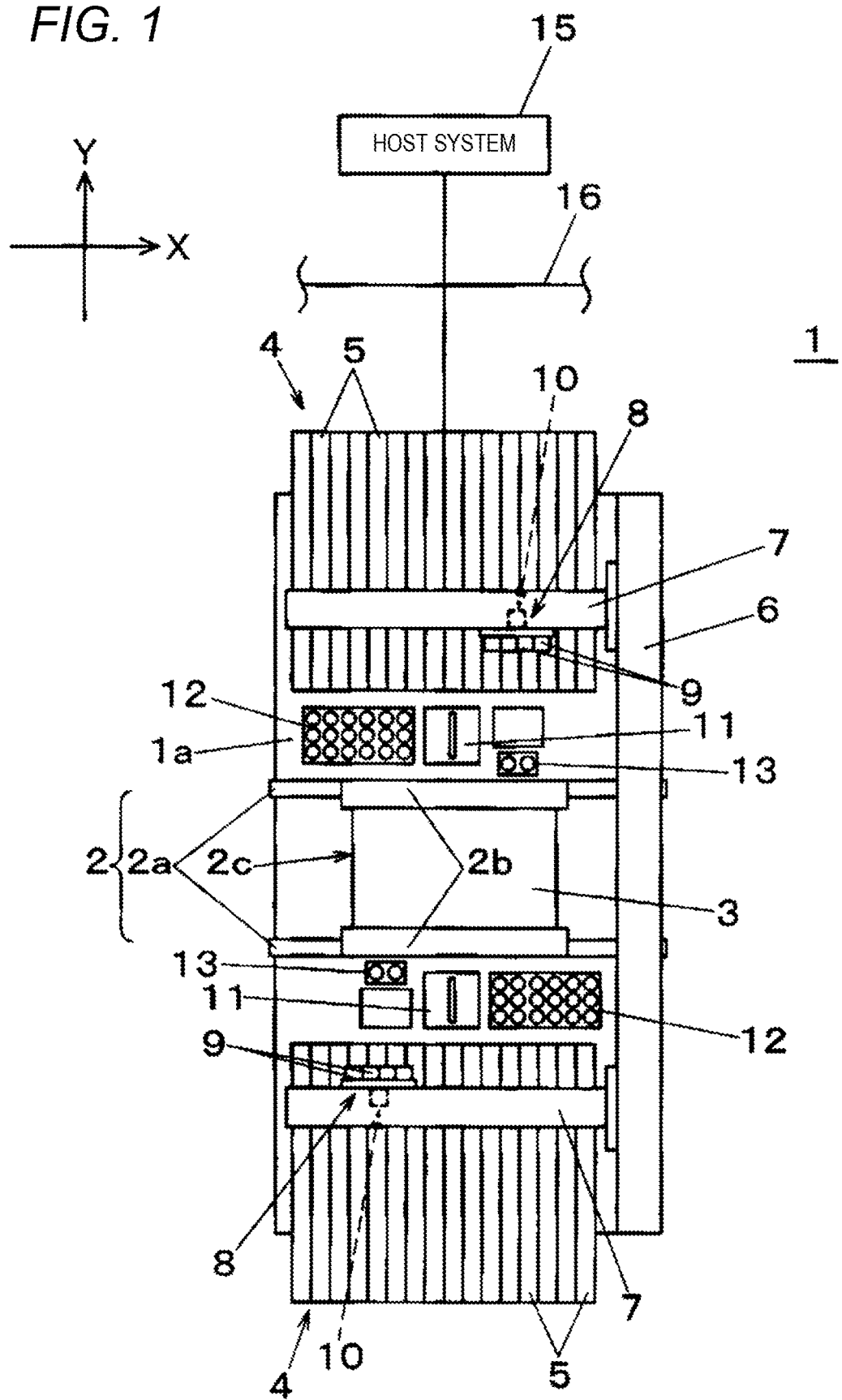
FIG. 1 is a plan view showing the configuration of an electronic component mounting machine according to an embodiment of the present invention.

As shown in FIG. 1, a board conveying mechanism 2 for conveyance in the X direction (board conveying direction) is disposed at the center in a base stage 1a. The board conveying mechanism 2 has functions of conveying a board 3 that has been carried in from the upstream side and positioning it at a mounting work position of a component mounting mechanism (described later), and has two conveyance rails 2a which are arranged parallel with each other. The board conveying mechanism 2 is equipped, at the center, with a board support mechanism 2c for supporting a board 3 that has been carried in and presser members 2b for clamping the board 3 that has been lifted up by the board support mechanism 2c by pressing, from above, its two side end portions that are opposed to each other.

Component supply units 4 for supplying electronic components to be mounted are disposed on the two respective sides of the board conveying mechanism 2. In each component supply unit 4, plural tape feeders 5 are arranged parallel with each other and each tape feeder 5 has a function of pitch-feeding components that are held by a carrier tape to a pick-up position of the component mounting mechanism (described later). A Y-axis movement table 6 is disposed on the top surface of the base stage 1a at one end in the X direction, and two X-axis movement tables 7 are attached to the Y-axis movement table 6 so as to be slidable in the Y direction. A mounting head 8 is attached to each X-axis movement table 7 so as to be slidable in the X direction.

Each mounting head 8, which is a multiple head that includes plural unit holding heads 9, picks up an electronic component P to be mounted from a tape feeder 5 and holds it by vacuum absorption by means of a component absorption nozzle 14A (see FIG. 7A) that is attached to a nozzle holder 9a that is attached to the lower end of each unit holding head 9. The Y-axis movement table 6 and the X-axis movement tables 7 constitute a head moving mechanism for moving the mounting heads 8.

By driving the head moving mechanism, each mounting head 8 is moved between the associated component supply unit 4 and a board 3 that has been positioned by the board conveying mechanism 2. Each mounting head 8 is lowered and elevated over the board 3, whereby the electronic component P (see FIG. 7A) held by the mounting head 8 are mounted on the board 3. The mounting heads 8 and the head moving mechanism for moving the mounting heads 8 constitute a component mounting mechanism 17 (see FIG. 8) for picking up components from the component supply units 4 and mounting them on a board 3.

A board recognition camera 10 is attached to the lower surface of each X-axis movement table 7 so as to be moved together with the associated mounting head 8. The board recognition camera 10 shoots a recognition mark formed on a board 3 being held by the board conveying mechanism 2 when moved to over the board 3 as the head moving mechanism is driven. A component recognition camera 11, a first nozzle housing unit 12, and a second nozzle housing unit 13 are disposed in the movement path of each mounting head 8 between the associated component supply unit 4 and the board conveying mechanism 2.

Figure 6A:
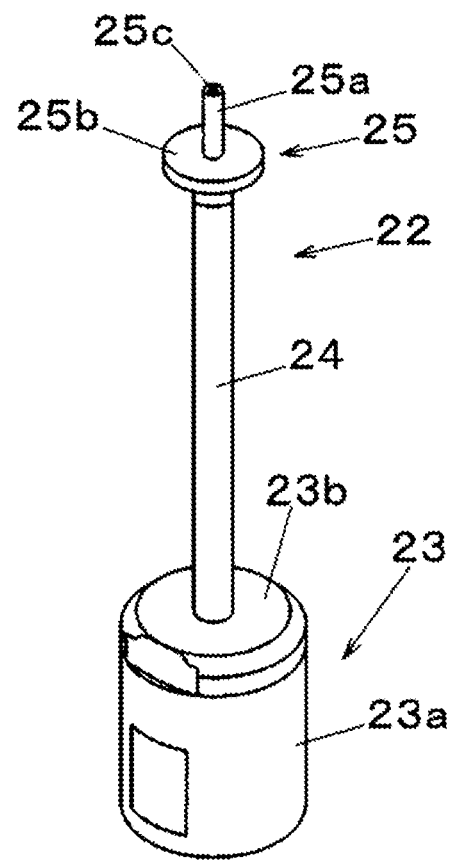
FIGS. 6A and 6B illustrate the structure of each support pin module which is used in the board support mechanism of the electronic component mounting machine according to the embodiment of the invention.

When a mounting head 8 that has picked up a component from the component supply unit 4 passes over the component recognition camera 11 in a prescribed direction (scan operation), the component recognition camera 11 shoots the component being held by the mounting head 8. Plural absorption nozzles 14A corresponding to respective component types and to be attached to the nozzle holders 9a of the unit holding heads 9 are housed in the first nozzle housing unit 12. Absorption nozzles 14B (see FIG. 7B) each of which is used being attached to the nozzle holder 9a of a unit holding head 9 when a support pin module 22 shown in FIG. 6A is moved are housed in the second nozzle housing unit 13. An absorption nozzle attached to a unit holding head 9 can be replaced to one suitable for a purpose or a target component type as a result of a nozzle replacement operation that is performed by a mounting head 8 by accessing the associated first nozzle housing unit 12 or second nozzle housing unit 13.

Figure 2A:
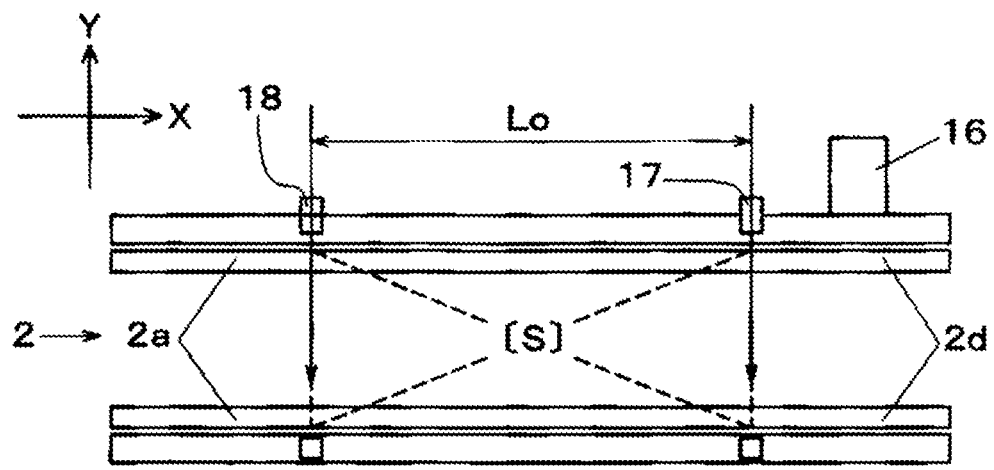
FIGS. 2A and 2B illustrate the configurations of a board conveying mechanism and a board support mechanism of the electronic component mounting machine according to the embodiment of the invention.
Figure 2B:
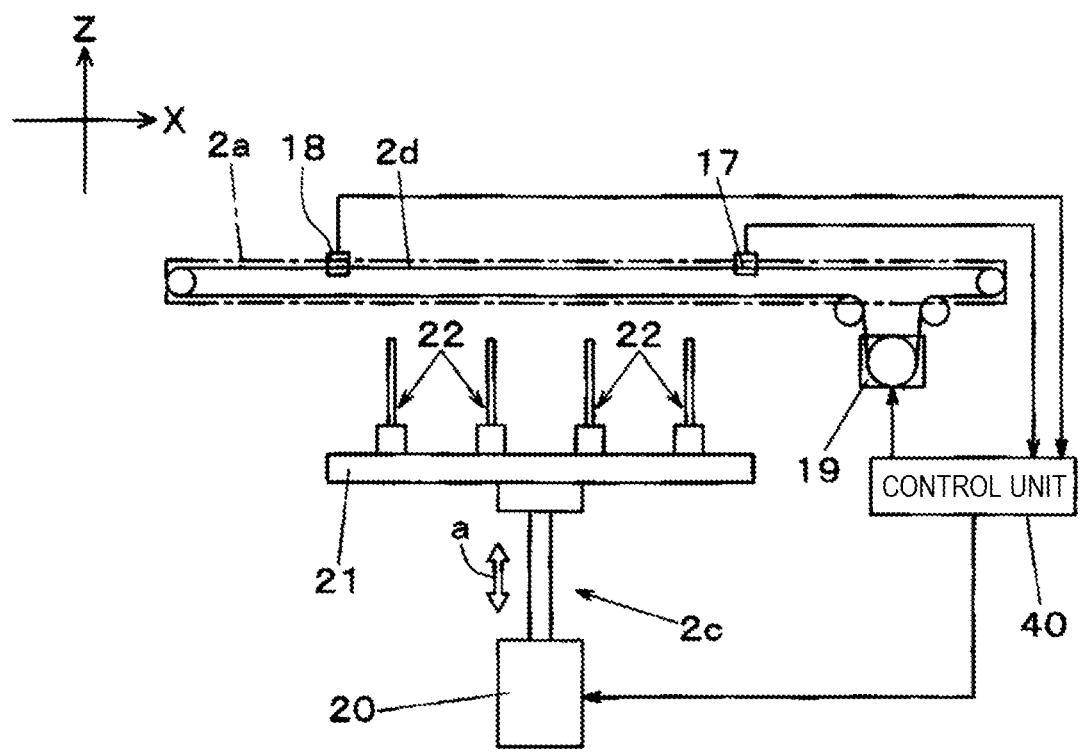

Next, referring to FIGS. 2A and 2B and FIGS. 3A and 3B, a description will be made of how a place where mounting work is performed with the board conveying mechanism 2 of the electronic component mounting machine 1, that is, a mounting stage where component mounting work is performed on a board 3 by the above-described component mounting mechanism, is formed. As shown in FIG. 2A, the board conveying mechanism 2 is equipped with conveyor mechanisms 2d which are disposed so as to extend in the X direction along the two conveyance rails 2a. As shown in FIG. 2B, the conveyor mechanisms 2d convey a board 3 in the X direction by means of conveyance belts that are reciprocated in the horizontal direction by a motor 19.

In the board conveying mechanism 2, a mounting stage [S] having a length Lo in the X direction is set in a movable range of each mounting head 8, that is, a working range in which component mounting by the component mounting mechanism 17 is possible. The mounting stage [S] is provided with a board holding unit for holding a board 3, and the board 3 is supported by the board support mechanism 2c from the lower side. The board support mechanism 2c is configured in such a manner that a horizontal, plate-like support base 21 is elevated and lowered (indicated by arrow "a") by an elevation mechanism 20. Pin modules 22 (support pins) for supporting a board 3 from the lower side are erected from the top surface of the support base 21.

The conveyance rails 2a are provided with a first positioning sensor 18A at a position corresponding to the downstream end of the mounting stage [S] and is also provided with a second positioning sensor 18B at a position that corresponds to the upstream end of the mounting stage [S] and is distant upstream from the first positioning sensor 18A by a distance Lo. The first positioning sensor 18A and the second positioning sensor 18B, each of which is an optical sensor, detect that the head 3c and the tail 3d (see FIGS. 3A and 3B) of a board 3 that has been conveyed by the conveyor mechanisms 2d have reached the positions of the first positioning sensor 18A and the second positioning sensor 18B when the head 3c and the tail 3d of the board 3 interrupt detection light beams of the first positioning sensor 18A and the second positioning sensor 18B, respectively.

Figure 8:
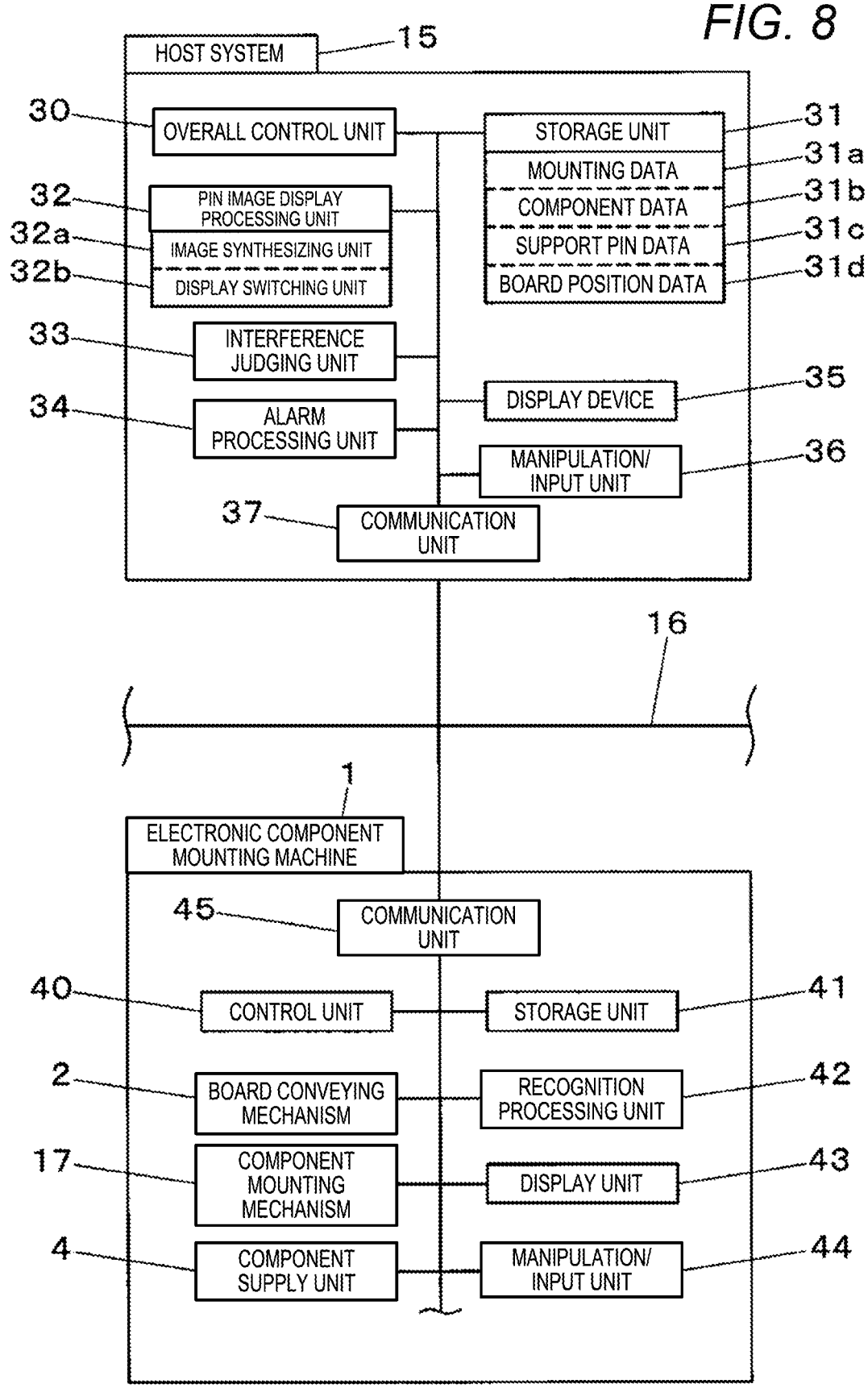
FIG. 8 is a block diagram showing the configuration of a control system of an electronic component mounting system that includes the electronic component mounting machine according to the embodiment of the invention.

Detection signals of the first positioning sensor 18A and the second positioning sensor 18B are transmitted to a control unit 40 (see FIG. 8). The control unit 40 controls the motor 19 and the elevation mechanism 20 on the basis of the received control signals, whereby the board 3 can be positioned at a prescribed position in the board conveying mechanism 2 and the part, in the working range, of the positioned board 3 can be held being supported from below. The first positioning sensor 18A, the second positioning sensor 18B, and the board support mechanism 2c constitute a board positioning mechanism for positioning a board 3 at a first mounting work position or a second mounting work position (described below) and holding it there.

Figure 3A:
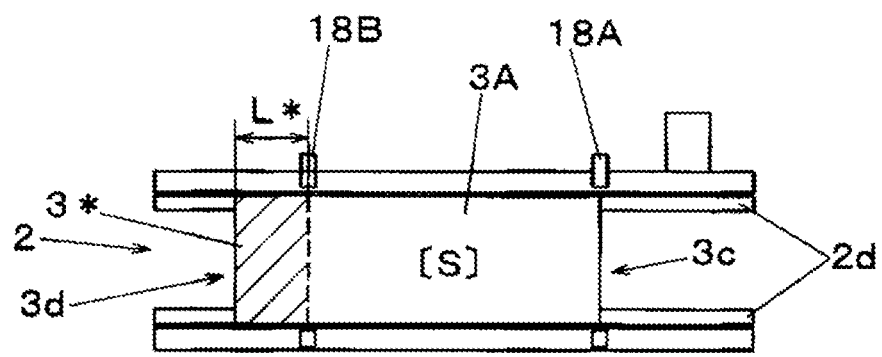
FIGS. 3A and 3B illustrate a board positioning method of a board holding unit of the electronic component mounting machine according to the embodiment of the invention.

Next, referring to FIGS. 3A and 3B, a description will be made of board positioning done in a case that a board 3A (see FIG. 12) that is longer than the length Lo of the mounting stage [S] is to be subjected to mounting work. To deal with a board 3A that is longer than the length Lo of the mounting stage [S], first, as shown in FIG. 3A, the board 3 is positioned at a position (first mounting work position) where its head 3c is located at the detection optical axis position of the first positioning sensor 18A. In this state, a sticking-out portion 3* having a sticking-out length L* sticks out upstream from the mounting stage [S] and component mounting mechanism 17 cannot perform component mounting work on the sticking-out portion 3*.

Figure 3B:
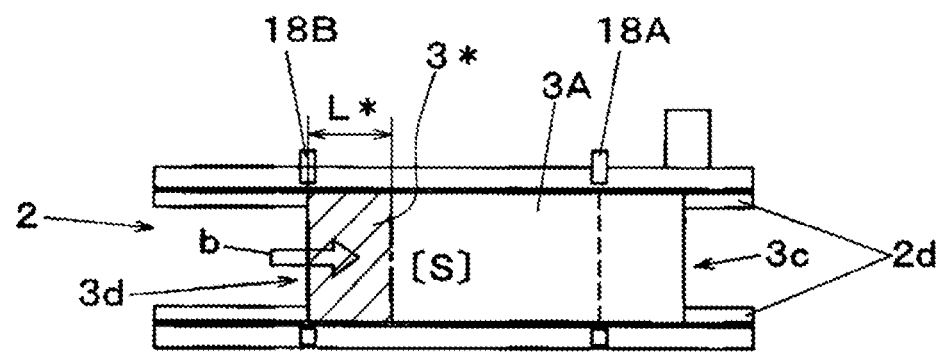

Therefore, as shown in FIG. 3B, the board 3A is moved downstream by the conveyor mechanisms 2d (indicated by arrow "b") and is positioned at a position (second mounting work position) where its tail 3d is located at the detection optical axis position of the second positioning sensor 18B. As a result, in the state that the board 3A is positioned at the second mounting work position, the sticking-out portion 3* is included in the range of the mounting stage [S] and hence can be subjected to component mounting work of the component mounting mechanism 17. That is, in the embodiment, in the case where a board 3A is to be dealt with that is longer than the working range in which component mounting work can be performed by the component mounting mechanism 17, component mounting work is performed plural times on the board 3A as it is positioned successively at plural mounting work positions including at least the first mounting work position and the second mounting work position.

Figure 4A:
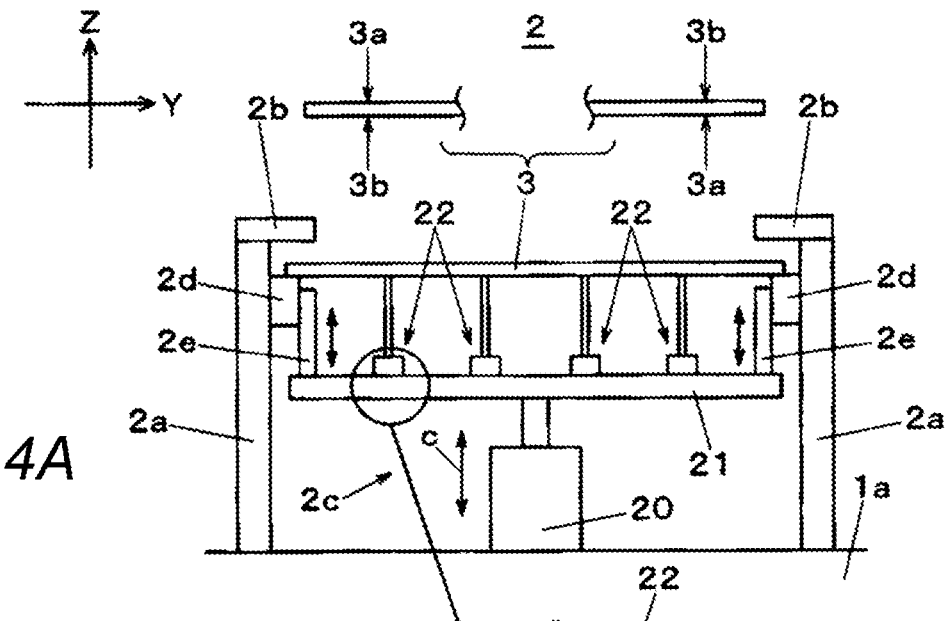
FIGS. 4A and 4B illustrate the configuration of the board support mechanism of the board holding unit of the electronic component mounting machine according to the embodiment of the invention.
Figure 4B:
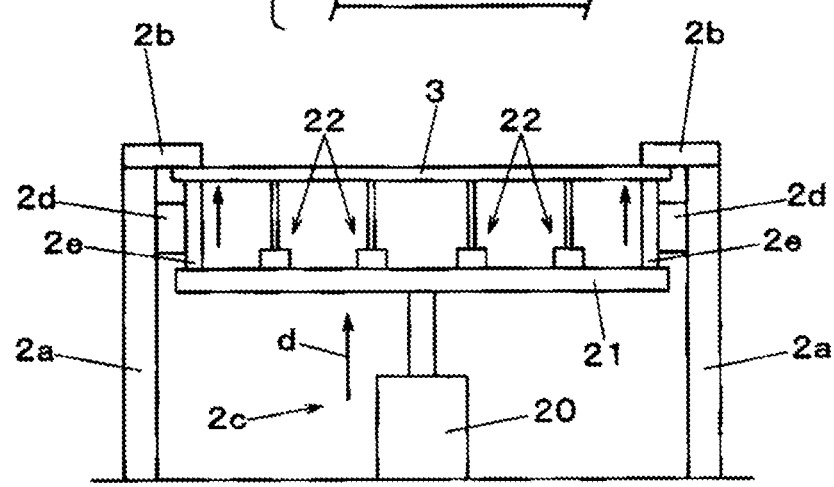

Next, referring to FIGS. 4A and 4B, a description will be made of the configuration and the functions of the board support mechanism 2c which is provided in the board conveying mechanism 2. As shown in FIGS. 2A and 2B, the conveyor mechanisms 2d are disposed inside the two conveyance rails 2a which are part of the board conveying mechanism 2, so as to extend in the conveying direction. A board 3 is conveyed in the board conveying direction by driving the conveyor mechanisms 2d in a state that two respective side end portions of the board 3 are in contact with the top surfaces of the conveyor mechanisms 2d. Clamp members 2e for supporting respective side end portions of a board 3 from below when the board 3 is clamped by pressing their side end portions by from above by the respective presser members 2b are disposed inside the conveyor mechanisms 2d so as to be able to elevated and lowered because they are in contact with the support base 21.

The board support mechanism 2c which is disposed at the center of the board conveying mechanism 2 so as to correspond to the mounting stage [S] is configured in such a manner that the horizontal, plate-like support base 21 is elevated and lowered (indicated by arrow "c") by the elevation mechanism 20. The pin modules 22 for supporting a board 3 from the lower side are erected from the top surface of the support base 21. In the embodiment, boards 3 to be supported include double-sided mounting boards having first surface 3a and second surface 3b (front surface and back surface) which are both to be mounted with electronic components.

Figure 5A:
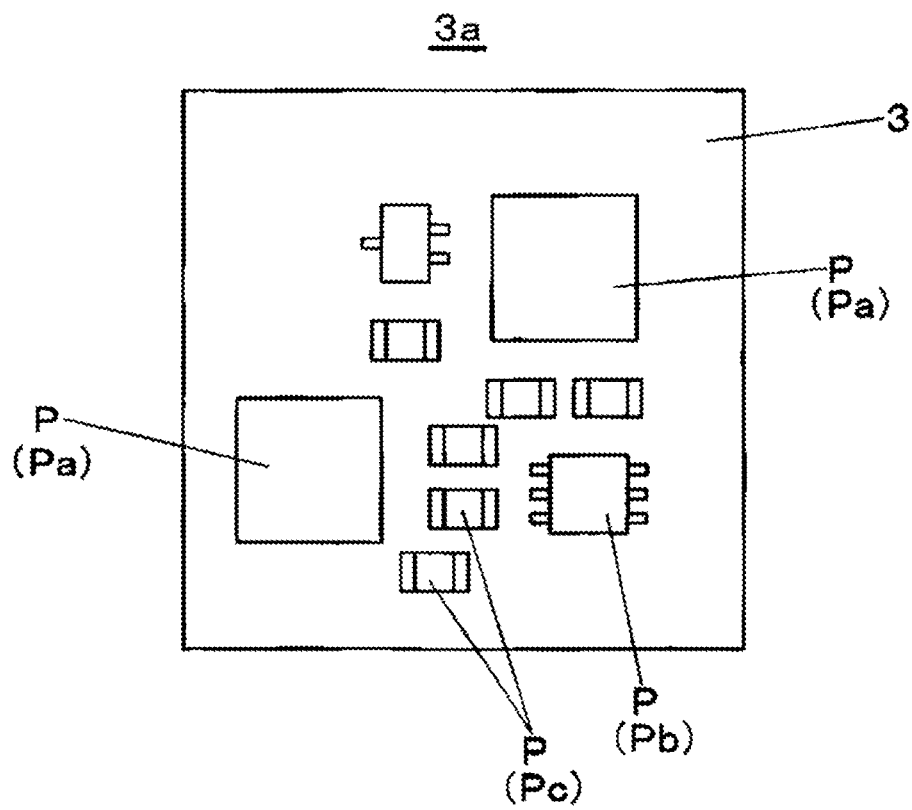
FIGS. 5A and 5B illustrate a board as a work subject of the electronic component mounting machine according to the embodiment of the invention.
Figure 5B:
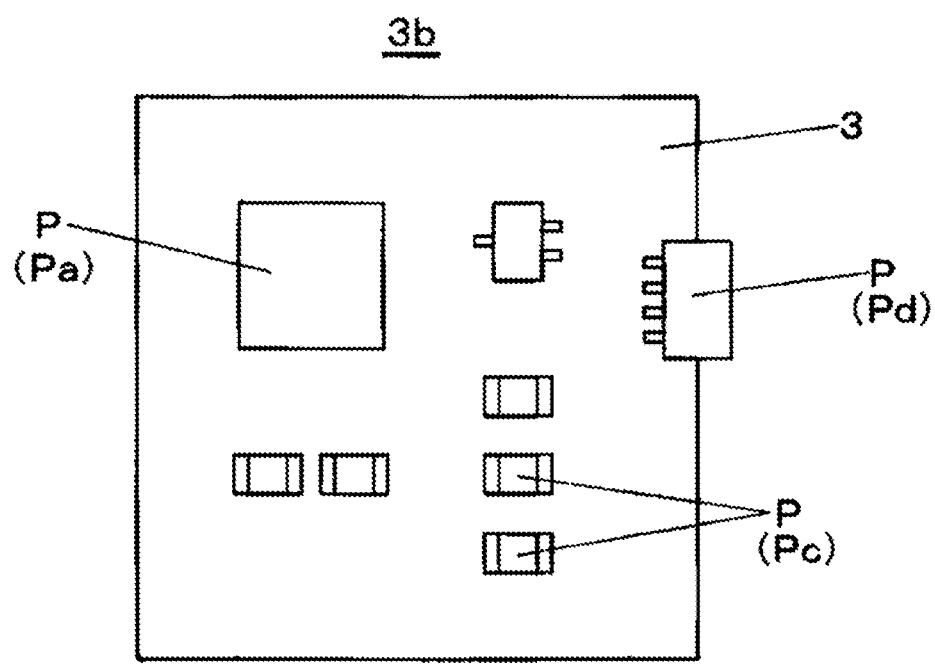

FIGS. 5A and 5B show an example of such double-sided mounting boards. In this example, the first surface 3a shown in FIG. 5A is to be mounted with plural kinds of electronic components P (e.g., BGA components Pa, DIP components Pb, chip components Pc, etc.). The second surface 3b shown in FIG. 5B is to be mounted with plural kinds of electronic components P including a connector component Pd. When the first surface 3a is a mounting subject surface, the second surface 3b is made a surface to be supported, and vice versa.

When the surface to be supported is an already mounted surface that has been mounted with electronic components in a preceding process, it is necessary to select a support pin arrangement that does not cause interference with the support pin modules 22 taking positions of already mounted components on the already mounted surface into consideration. To this end, the embodiment employs such a configuration that the support pin modules 22 can be placed at any positions on the support base 21. More specifically, the support base 21 has a structure that the top surface of a plate member 21b made of a non-magnetic material such as aluminum is coated with a magnetic material 21a such as steel and the support pin modules 22 are placed at desired positions according to support positions of a board 3 to be supported.

Magnetic attractive force occurs between the magnetic material 21a and a magnet member 27 (see FIG. 6B) that is provided in a base portion 23 of each support pin module 22 being set in a support state, whereby the support pin module 22 is fixed to the support base 21. The entire support base 21 may be made of a magnetic material; it suffices that at least a top layer of the support base 21 be made of a magnetic material. As shown in FIG. 4B in this state the support base 21 is elevated (indicated by arrow "d") by driving the elevation mechanism 20, whereby the top ends of the support pin modules 22 and the top ends of the clamp members 2e come into contact with the lower surface of the board 3. The board 3 is supported by the board support mechanism 2c, and the position of the board 3 is fixed because its two respective end portions are pressed against the lower surfaces of the presser members 2b.

Next, the structure and the functions of each support pin module 22 will be described with reference to FIGS. 6A and 6B. As shown in FIG. 6A, each support pin module 22 is configured in such a manner that a hollow shaft 24 extends upward from a base portion 23 which is in contact with the support base 21. A top portion 25 which is attached to the top end of the shaft 24 has a contact portion 25a which projects upward and is shaped like a narrow-diameter pin and an absorption brim 25b which extends laterally. The contact portion 25a supports a board 3 with its top end being in contact with the lower surface of the board 3. A suction hole 24a penetrates through the shaft 24 and communicates with a suction hole 25c which penetrates through the contact portion 25a in the vertical direction.

Figure 6B:
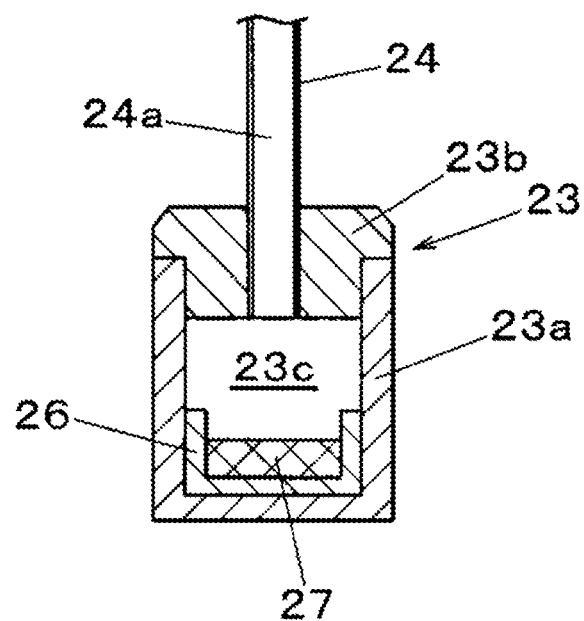

As shown in FIG. 6B, the base portion 23 is configured in such a manner that a lid member 23b to which the shaft 24 is fixed is combined with a base portion body 23a inside which a cylindrical elevation room 23c is formed. A piston 26 to which a magnet member 27 is attached is fitted in the elevation room 23c so as to be slidable in the vertical direction. In an ordinary state, the piston 26 is located at the bottom in the elevation room 23c and the base portion 23 is fixed to the magnetic material 21a by the magnetic attractive force of the magnet member 27.

When vacuum suction is done through the suction hole 24a of the shaft 24, the piston 26 is elevated in the elevation room 23c and the distance between the lower surface of the magnet member 27 and the top surface of the magnetic material 21a is thereby increased. As a result, the magnetic attractive force acting between the magnet member 27 and the magnetic material 21a is weakened to a large extent, whereby the fixing of the base portion 23 to the support base 21 is canceled. That is, the support pin module 22 includes the base portion 23 which contacts the support base 21 provided in the board holding unit, and the magnet for fixing the support pin module 22 to the base 23 is provided in the base portion 23. Each support pin module 22 can thus be placed at any position on the support base 21.

Figure 7A:
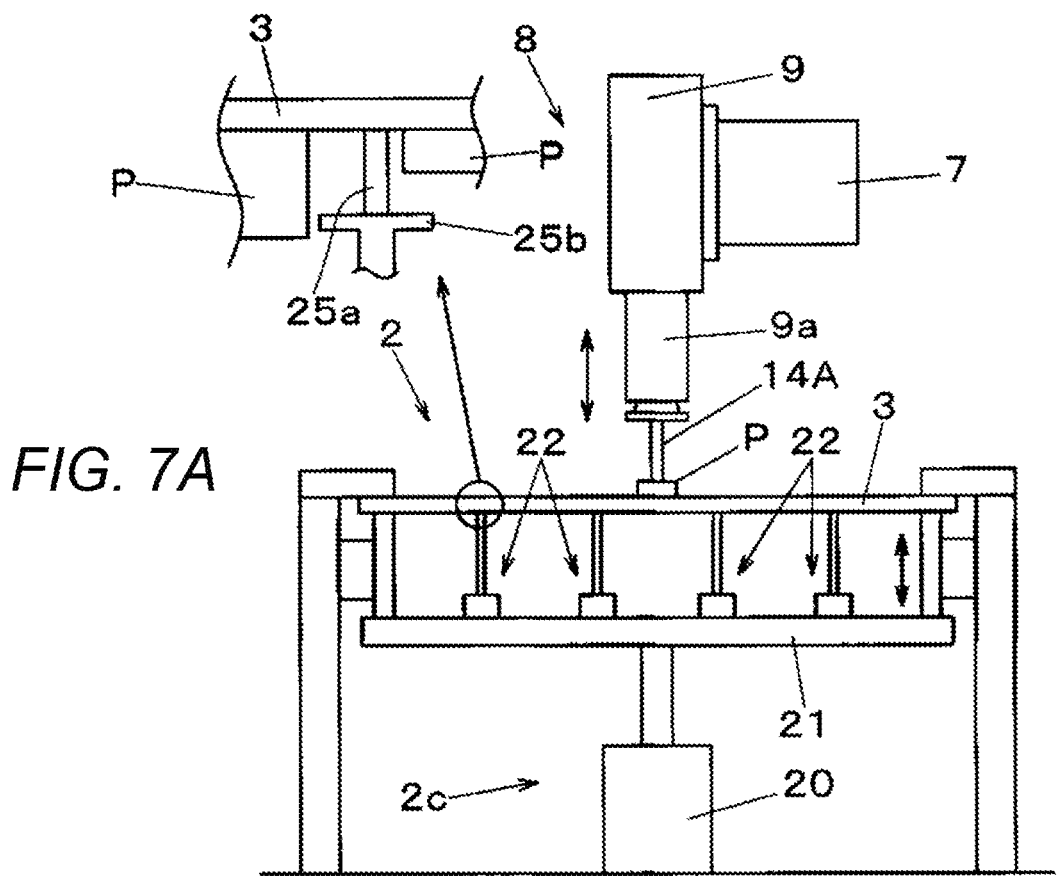
FIGS. 7A and 7B illustrate the functions of each support pin module of the board holding unit of the electronic component mounting machine according to the embodiment of the invention.

FIG. 7A shows a state that an electronic component P is being mounted on a board 3 that is supported and held by the board support mechanism 2c, by a mounting head 8 in which an absorption nozzle 14A is attached to a nozzle holder 9a. In this state, the top ends of the contact portions 25a of the support pin modules 22 support the board 3 from the lower side. Even if the surface to be supported of the board 3 is an already mounted surface and is mounted with electronic components P, the absorption brims 25b and the contact portions 25a are prevented from interfering with the already mounted electronic components P by properly setting the arrangement of the support pin modules 22 on the support base 21.

Figure 7B:
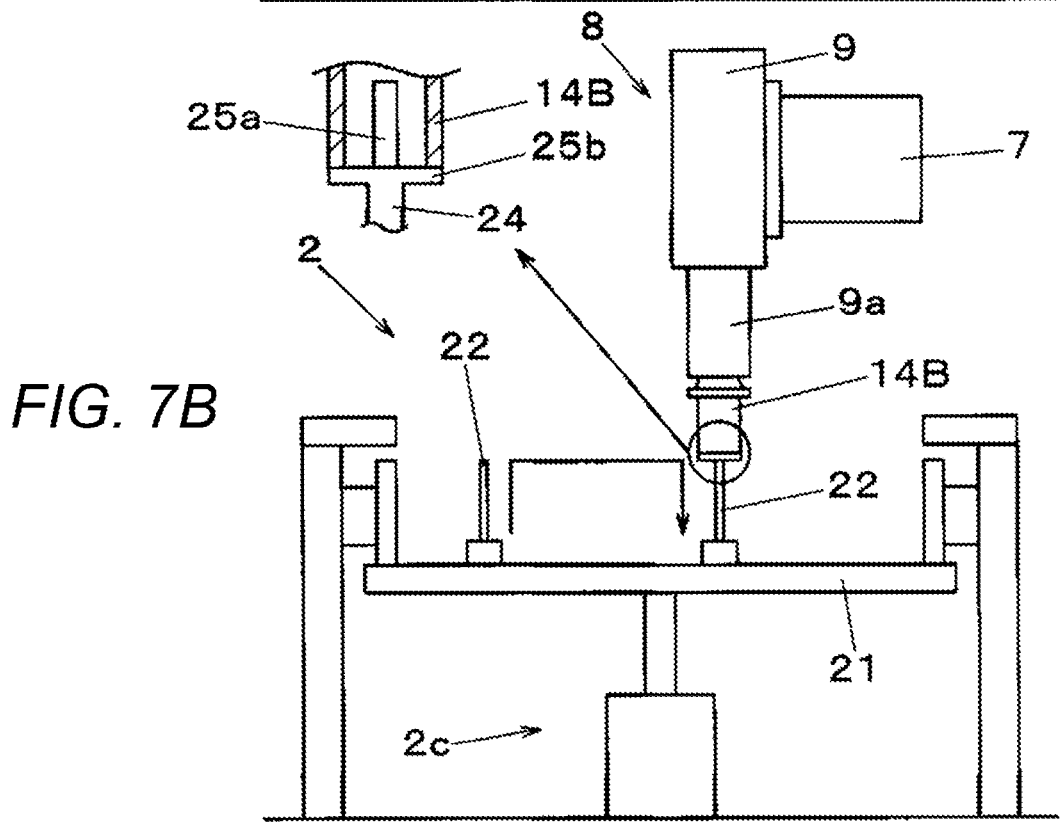

FIG. 7B shows an operation of moving a support pin module 22 that is placed on the support base 21. In this operation, a mounting head 8 in which an absorption nozzle 14B is attached to a nozzle holder 9a is moved to over the support pin module 22 and vacuum suction is done with the top portion 25 covered with the absorption nozzle 14B. As a result, the magnetic attractive force of the magnet member 27 acting between the base portion 23 and the magnetic material 21a in the structure shown in FIGS. 6A and 6B is weakened and the absorption nozzle 14B absorbs and holds the absorption brim 25b. In this state, the support pin module 22 is moved by moving the mounting head 8.

Next, referring to FIG. 8 to FIGS. 11A-11C, a description will be made of the configuration of a control system of an electronic component mounting system including the electronic component mounting machine 1 and a support pin arrangement determination assisting function of the electronic component mounting system. This function is to assist the determination of an arrangement of the support pin modules 22 which support an already mounted surface of a board 3 from the lower side in the board holding unit having the board support mechanism 2c.

As shown in FIG. 8, the host system 15 is equipped with an overall control unit 30, a storage unit 31, a pin image display processing unit 32, an interference judging unit 33, an alarm processing unit 34, a display device 35, a manipulation/input unit 36, and a communication unit 37. The overall control unit 30, which is a processing/computing device, supervises support pin arrangement determination assistance processing work of the electronic component mounting machine 1 on the basis of various programs and data stored in the storage unit 31.

Figure 10A:
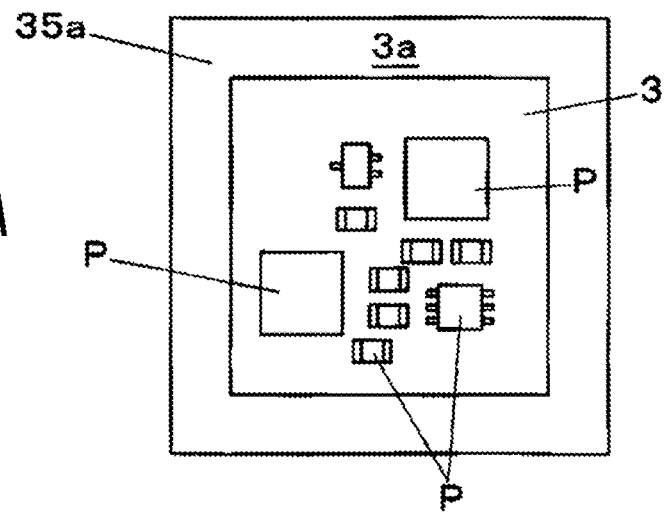
FIGS. 10A-10C illustrate a support pin arrangement determination assisting method in the electronic component mounting machine according to the embodiment of the invention.

In this processing work, as shown in FIG. 10A, an image indicating shapes and an arrangement of electronic components P on a board 3 are displayed on a display screen 35a of the display device 35 (display means) such as a liquid crystal panel and an operator inputs desired arrangement positions of the support pin modules 22 to the image through the manipulation/input unit 36 (position input unit) having a pointing device such as a mouse.

Images to be displayed on the display screen 35a include a board image (first board image) indicating shapes and an arrangement of already mounted components on the already mounted surface of the board 3 a board image (second board image) indicating shapes and an arrangement of components to be mounted on the mounting subject surface. The reason why the second board image is also displayed is that as described later a certain type of component to be mounted requires disposition of a support pin module 22 to support it or its neighborhood from the lower side during a mounting operation. The board image may be a camera image acquired by shooting an actual board as well as an image that is based on image data such as CAD data that is output at a designing stage.

Support pin arrangement data indicating determined arrangement positions of the support pin modules 22 is transmitted from the communication unit 37 to the electronic component mounting machine 1 over the communication network 16. In the electronic component mounting machine 1, the mounting heads 8 operate on the basis of the support pin arrangement data, whereby the support pin modules 22 are moved automatically on the support base 21 and a support pin arrangement suitable for the surface to be supported of the subject board 3 is realized.

The storage unit 31 stores mounting data 31a, component data 31b, support pin data 31c, and board position data 31d. The mounting data 31a is data that is necessary for a component mounting operation of the mounting heads 8 such as types, mounting position coordinates, etc. of electronic components to be mounted on the board 3. The component data 31b is data relating to three-dimensional shapes (see FIG. 9A) and component characteristics of electronic components to be mounted on the board 3, and the component characteristics include a support necessity characteristic indicating whether or not the board needs to be supported from the lower side for mounting the component on the mounting subject surface. The support pin data 31c is data relating to a three-dimensional shape of the top portion 25 of each support pin module 22.

The board position data 31d is positioning control data to be used in the case where the subject of mounting work is a board like the board 3A shown in FIGS. 3A and 3B, that is, positioning control data to be used for positioning the board 3A at each of plural mounting work positions (in the example being described, a first mounting work position and a second mounting work position) with respect to the mounting stage [S]. By referring to the board position data 31d, a board image corresponding to a state that the board 3A is positioned at each of the plural mounting work positions can be displayed.

The pin image display processing unit 32 performs processing for displaying to the display device 35 an image to be referred to by an operator in inputting arrangement positions of the support pin modules 22 on the support base 21. The pin image display processing unit 32 is equipped with processing functional units that are an image synthesizing unit 32a and a display switching unit 32b. The image synthesizing unit 32a performs processing of generating a composite image by superimposing, on a board image, a pin arrangement image that has been produced as a result of input via the manipulation/input unit 36 of pin arrangement positions by an operator.

One of a first board image indicating shapes and an arrangement of already mounted components on an already mounted surface and a second board image indicating shapes and an arrangement of components to be mounted on a mounting subject surface (see FIGS. 5A and 5B) can be selected as the board image. For example, if the first surface 3a shown in FIG. 5A is an already mounted surface, the first surface 3a is made the first board image and the second surface 3b shown in FIG. 5B is made the second board image for a mounting subject surface. That is, the pin image display processing unit 32 displays, on the display device 35, a composite image produced by superimposing a pin arrangement image indicating input arrangement positions on the first board image or the second board image.

Figure 10B:
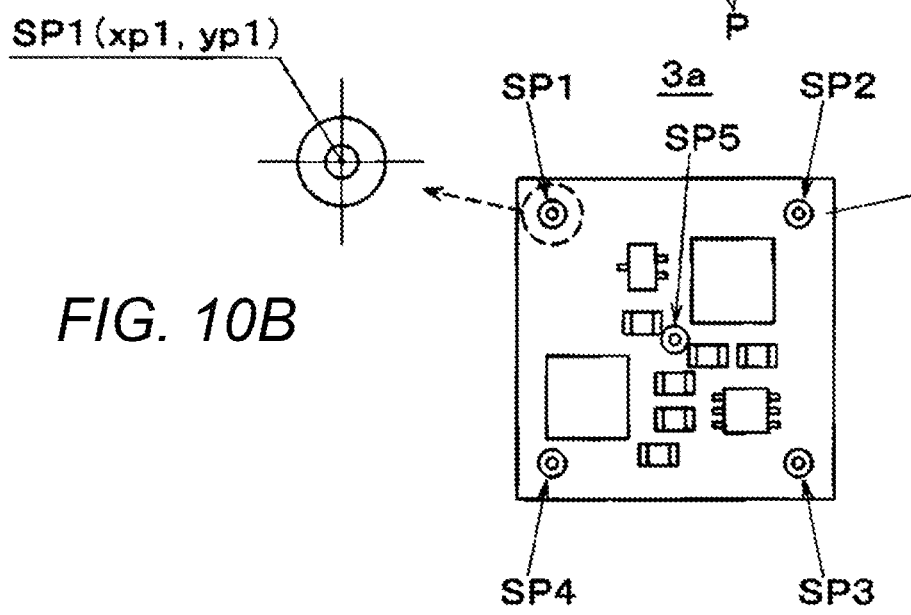

FIG. 10B shows an example composite image produced by superimposing a pin arrangement image on the first surface 3a which is a first board image. An operator observes the first board image and inputs, using the pointing function of the manipulation/input unit 36, a pin arrangement that allows the board 3 to be supported in a well-balanced manner and does not cause interference with the already mounted components. In this example, five points, that is, arrangement positions SP1-SP5, have been input, whereby position coordinates (xpi, ypi) of each arrangement position SPi are taken in. In this example, the arrangement position SP5 which is located at the center is interposed between two close, already mounted components and hence consideration should be given to whether or not interference occurs between a support pin modules 22 and these already mounted components. In the embodiment, whether or not such interference occurs is judged automatically using the already stored shape data and position data and the input data of the arrangement positions SP.

Figure 9A:
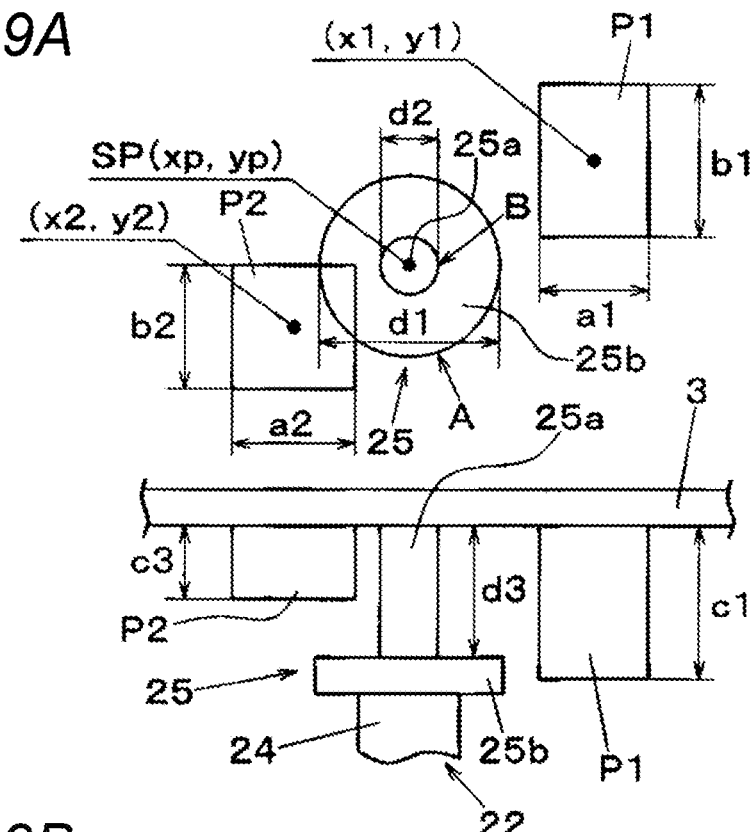
FIGS. 9A-9C illustrate component data and support pin data used in the electronic component mounting machine according to the embodiment of the invention.

Referring to FIG. 9A, a description will now be made of a planar image of each support pin module 22 in the above-mentioned pin arrangement image. FIG. 9A which is a plan view shows a planar image in a state that an already mounted surface of a board 3 is supported by a support pin module 22. This planar image includes an image of the top portion 25 which is attached to a shaft 24 erected in the board holding unit and an image of the contact portion 25a (the tip portion of the top portion 25) which is smaller in sectional shape than the absorption brim 25b and is to support the board 3 by contacting its lower surface. In this planar image of the support pin module 22, an outline portion A and a central portion B of the top portion 25 correspond to the absorption brim 25b (outer circumference) and the contact portion 25a of the top portion 25, respectively.

In displaying a composite image, the display switching unit 32b performs processing of displaying one of (i.e., switching between) a composite image (see FIG. 10B) that is based on a first board image and a composite image (see FIG. 10C) that is based on a second board image. Since the first board image and the second board image are a back image and a front image of the same board, in making this switching the first board image and the second board image are displayed so as to have a mirror-image-like positional relationship by making image data inversion. This allows an operator to refer to a board image as would be seen as a plan view when a board 3 is actually positioned with respect to the mounting stage [S].

In a case in which the second image 3B shown in FIG. 5B is a mounting subject surface, since it includes the connector component Pd as a component to be mounted, it is necessary to determine a pin arrangement taking the position of the connector component Pd into consideration. That is, since in mounting, on the board 3, the connector component Pd which is a fitting component it needs to be pressed against the board 3 with a larger load than an ordinary surface mounting component is, it is desirable to support the connector component Pd or its neighborhood from the lower side to prevent warp deformation of the board 3.

In the embodiment, as described above, each electronic component that needs to be supported from the opposite surface side during a mounting operation is determined in advance and a related description is made in the component data 31b as one item of its component characteristics. If an electronic component that needs to be supported exists for a mounting subject surface, the pin image display processing unit 32 causes display of a second board image that indicates shapes and an arrangement of components to be mounted on the mounting subject surface. That is, the pin image display processing unit 32 a composite image that is based on the second board image on the display device 35 on the basis of support necessity that is described in the data relating to component characteristics that are included in the component data 31b.

Figure 10C:
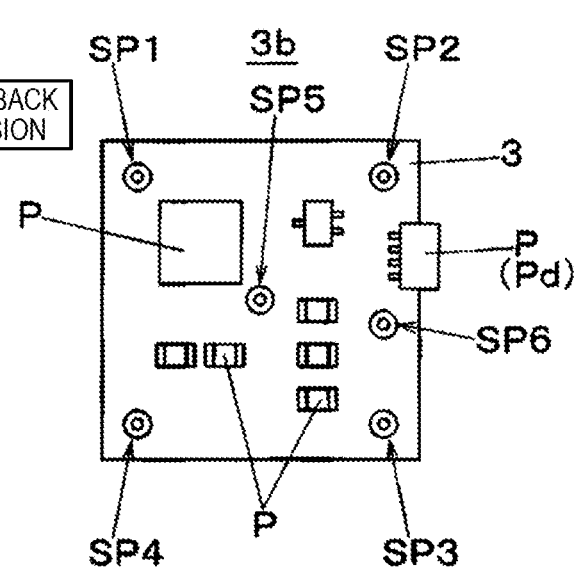

FIG. 10C shows an example that a second board image that is an image of the second surface 3b is displayed on the display screen 35a in place of a first board image. In this example, the second surface 3b has the connector component Pd that is described as a support-necessary component in the component data 31b. Therefore, an operator observes the second board image and selects a position that is in the region of the connector component Pd and its neighborhood and is suitable for support of the board 3, that is, a position that does not cause interference with any already mounted components in the first surface 3a. In this example, an arrangement position SP6 is input that is in the vicinity of the connector component Pd and bears no already mounted component on the first surface 3a.

In this work, since both of the first surface 3a and the second surface 3b need to be observed, there may occur a case that front/back inversion needs to be made plural times repeatedly. In this case, switching can be made between the first board surface and the second board surface with desired timing by the function of the display switching unit 32b by manipulating a front/back inversion button 35b displayed on the display screen 35a.

The interference judging unit 33 judges whether or not some of the support pin modules 22 for which arrangement positions have been input interfere with already mounted components existing on the surface to be supported on the basis of the three-dimensional shape data of the electronic components included in the component data 31b and the three-dimensional shape data, included in the support pin data 31c, of the contact portion of the support pin module 22, that is, the top portion 25 that is to come into contact with the surface to be supported of the board 3.

FIG. 9A shows examples of three-dimensional shape data of electronic components and the top portion 25. More specifically, stored as part of the component data 31b are (a1, b1, c1), (a2, b2, c21), . . . that represent dimensions in the X, Y, and Z directions of electronic components P1, P2, . . . to be mounted on the board 3. Stored as the support pin data 31c are (d1, d2, d3) that represent dimensions of the top portion 25 of the support pin module 22, that is, the diameter of the absorption brim 25b, the diameter and the length of the contact portion 25a.

Positions of already mounted electronic components P1, P2, . . . on the already mounted surface are given by sets of mounting coordinates (x1, y1), (x2, y2), . . . that are stored as part of the mounting data 31a. An arrangement position SP (xp, yp) where a support pin module 22 is to be placed is input performing a manipulation on a picture displayed on the display screen 35a using the manipulation/input unit 36. The interference judging unit 33 judges whether or not positional interference occurs between the top portion 25 and the electronic components P1, P2, . . . on the basis of those three-dimensional shape data and position data.

Figure 9B:
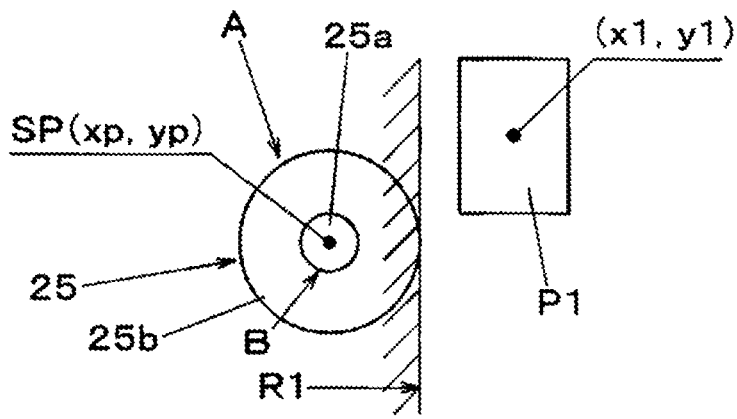
Figure 9C:
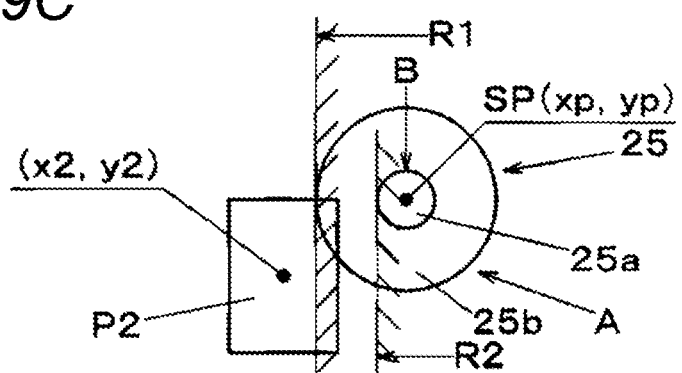

For example, as shown in FIG. 9B, since as for the relationship between an electronic component P1 and the top portion 25 the dimension c1 is larger than d3, a judgment "no interference" is made unless the outer surface of the electronic component P1 is located inside a first interference region R1 that is defined by the arrangement position SP (xp, yp) and the diameter d1 of the absorption brim 25b. As shown in FIG. 9C, since as for the relationship between an electronic component P2 and the top portion 25 the dimension c3 is smaller than d3, a judgment "no interference" is made unless the outer surface of the electronic component P2 is located inside a second interference region R2 that is defined by the diameter d1 of the absorption brim 25b even if the outer surface of the electronic component P1 is located inside the first interference region R1 which is defined by the arrangement position SP (xp, yp) and the diameter d1 of the absorption brim 25b. That is, the interference judging unit 33 judges occurrence/non-occurrence of three-dimensional positional interference between already mounted components such as the electronic components P1 and P2 and the contact portion 25a in the region between an outline portion A and a central portion B.

If the interference judging unit 33 judges that there is occurrence of interference, the alarm processing unit 34 performs processing of displaying an alarm picture for announcing that fact on the display device 35. Recognizing the alarm picture, the operator changes the arrangement position SP (xp, yp). With the above processing, even in a case that the surface to be supported is an already mounted surface that is mounted with electronic components at a high density, occurrence/non-occurrence of interference can be judged more precisely and a support pin arrangement can be realized with higher accuracy. The alarm processing unit 34 and the display device 35 constitute an alarming means for announcing a judgment result "occurrence of interference" using the display device 35 upon that judgment is made.

In a case in which the mounting subject board is of such a kind as to be positioned at plural mounting work positions (in the example being described, the first mounting work position and the second mounting work position) with respect to the mounting stage [S] like the board 3A shown in FIGS. 3A and 3B, the pin image display processing unit 32 performs the following processing. In this case, different portions of the same board 35A are supported by the plural support pin modules 22 that are arranged on the support base 21 in advance. Therefore, it is necessary to determine arrangement positions so that the support pin modules 22 can support the board 3A properly irrespective of whether the board 3A is positioned at the first mounting work position or the second mounting work position. To this end, the pin image display processing unit 32 causes display, as superimposed on each board image, of a pin arrangement image produced with an assumption that the board 3A is positioned at each of the first mounting work position and the second mounting work position. The operator adjusts the pin arrangement positions so as to prevent interference with the already mounted components in either state.

Figure 11A:
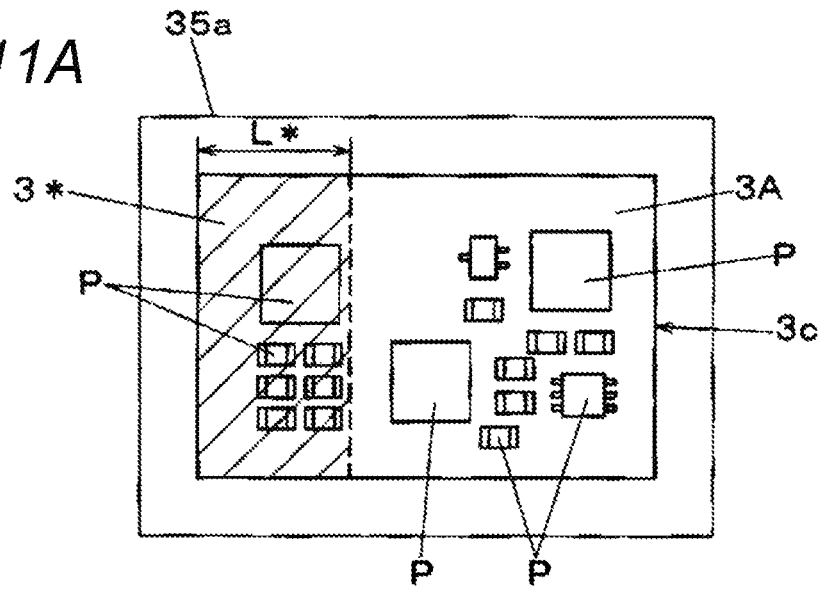
FIGS. 11A-11C also illustrate the support pin arrangement determination assisting method in the electronic component mounting machine according to the embodiment of the invention.
Figure 11B:
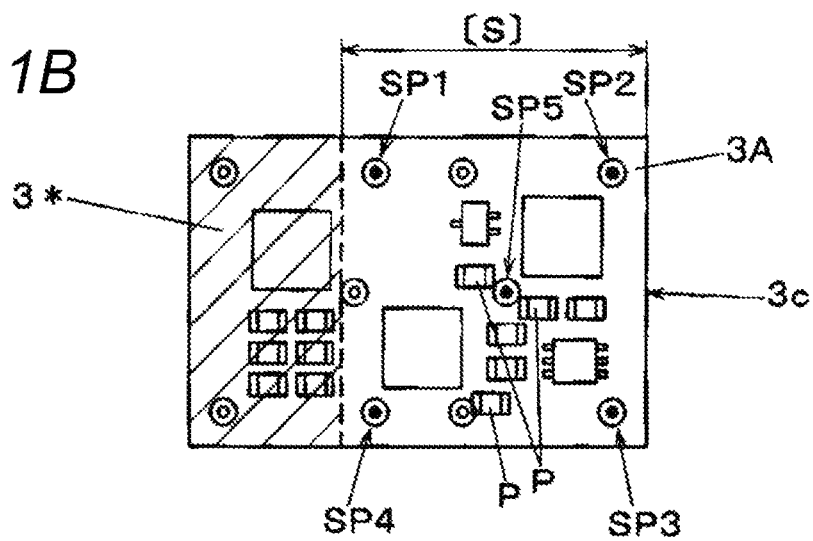

In the example being described, as shown in FIG. 11A, a board image of the board 3A is displayed on the display screen 35a of the display device 35. Subsequently, in a state that the board is positioned at the first mounting work position, arrangement positions SP (in this example, five arrangement positions SP1-SP5) for support of a mounting area (i.e., an area excluding a sticking-out portion 3* having a sticking-out length L*) occupying the mounting stage [S] are selected and input using the manipulation/input unit 36. A composite image shown in FIG. 11B is generated by superimposing an image of the input arrangement positions (first pin arrangement image) on the board image and displayed on the display screen 35a.

Although an arrangement position SP3 in the first pin arrangement image that corresponds to the first mounting work position does not cause interference with any already mounted components, it may cause interference with an already mounted component P in a second pin arrangement image (described below). In view of this, in inputting the arrangement position SP3, the operator selects a proper position taking into consideration interference with the already mounted electronic component P in the second pin arrangement image.

Figure 11C:
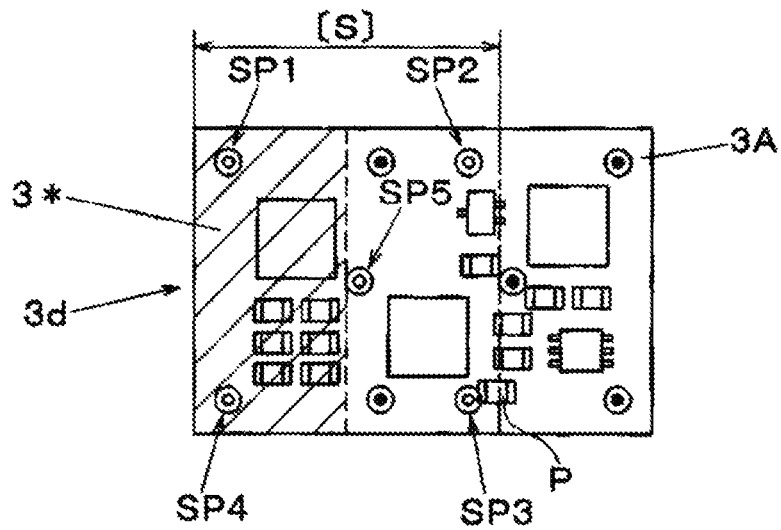

Then a composite image is generated by superimposing, on a board image, a second pin arrangement image produced with an assumption that the board 3A is positioned at the second mounting work position, and is displayed on the display screen 35a. That is, as shown in FIG. 11C, a second pin arrangement image is generated so as to be superimposed on the image of the input arrangement positions (first pin arrangement image) and a board image of the board 3A as moved to the second mounting work position on the basis of the board position data 31d so that the sticking-out portion 3* that was outside the mounting area when the board 3A was located at the first mounting work position is completely included in the mounting stage [S].

In other words, a second pin arrangement image is generated on the basis of the first mounting work position and the second mounting work position (the positioned positions of the board 3A) that are stored as the board position data 31d in advance and the image of the input arrangement positions (first pin arrangement image), and a composite image produced by superimposing both of the first pin arrangement image and the second pin arrangement image on the board image is displayed. By observing the thus-generated composite image, the operator can confirm that even in the state that the board 3A is moved to the second mounting work position a proper board support state can be realized that does not cause interference between the already mounted components and the support pin modules 22 arranged on the support base 21.

In displaying the above composite image, it is desirable that the planar images of the support pins that indicate the arrangement positions SP (i.e., first pin arrangement image and second pin arrangement image) be displayed in different colors or using different figures to enable discrimination between the sets of support pins corresponding to the respective pin arrangements. In the example shown in FIGS. 11A-11C, the arrangement positions SP1-SP5 in the first pin arrangement image shown in FIG. 11A are shown by symbols having central portions B (see FIGS. 9A-9C) drawn as black circles, and those in the second pin arrangement image shown in FIG. 11B are shown by symbols having central portions B drawn as white circles to facilitate discrimination between the two sets of arrangement positions SP1-SP5. This makes it possible to prevent an event that an arrangement position is selected erroneously, that is, the pin arrangement concerned is mistaken as one corresponding to a wrong mounting work position in selection of the arrangement positions. Thus, in the embodiment, a planar image of support pins in a first pin arrangement image and a planar image of support pins in a second pin arrangement image are displayed in different display forms.

That is, in the embodiment, in a case in which the above-described type of board 3A is a work subject board, the pin image display processing unit 32 performs processing of causing the display device 35 to display a composite image (see FIG. 11B or 11C) produced by superimposing, on a board image corresponding to the mounting area of each mounting work position, a first pin arrangement image of which arrangement positions have been input in a state that the board 3A is positioned at the first mounting work position and a second pin arrangement image generated on the basis of the first pin arrangement image with an assumption that the board 3A is positioned at the second mounting work position.

The electronic component mounting machine 1 is equipped with the control unit 40, a storage unit 41, a recognition processing unit 42, a display unit 43, a manipulation/input unit 44, and a communication unit 45. The control unit 40, which is a processing/computing device, controls the operations of the board conveying mechanism 2, the component supply units 4, and the component mounting mechanism 17 on the basis of operation programs and mounting data stored in the storage unit 41. The recognition processing unit 42 performs recognition processing on shooting results of the board recognition cameras 10 and the component recognition cameras 11. The display unit 43, which is a display panel such as a liquid crystal panel, displays guide pictures for manipulation of the manipulation/input unit 44 and various announcement pictures. The communication unit 45 exchanges signals with the host system 15 and other machines via the communication network 16.

In the above configuration, the overall control unit 30, the storage unit 31, the pin image display processing unit 32, the interference judging unit 33, the alarm processing unit 34, the display device 35, and the manipulation/input unit 36 constitute a support pin arrangement determination assisting apparatus for assisting the determination of an arrangement of support pins that support the already mounted surface of a board 3 or 3A from the lower side in the board holding unit of the electronic component mounting machine 1. Although the embodiment is directed to the example configuration in which the support pin arrangement determination assisting function is provided in a board 3, this function may be performed by the control processing function of the electronic component mounting machine 1.

Figure 12:
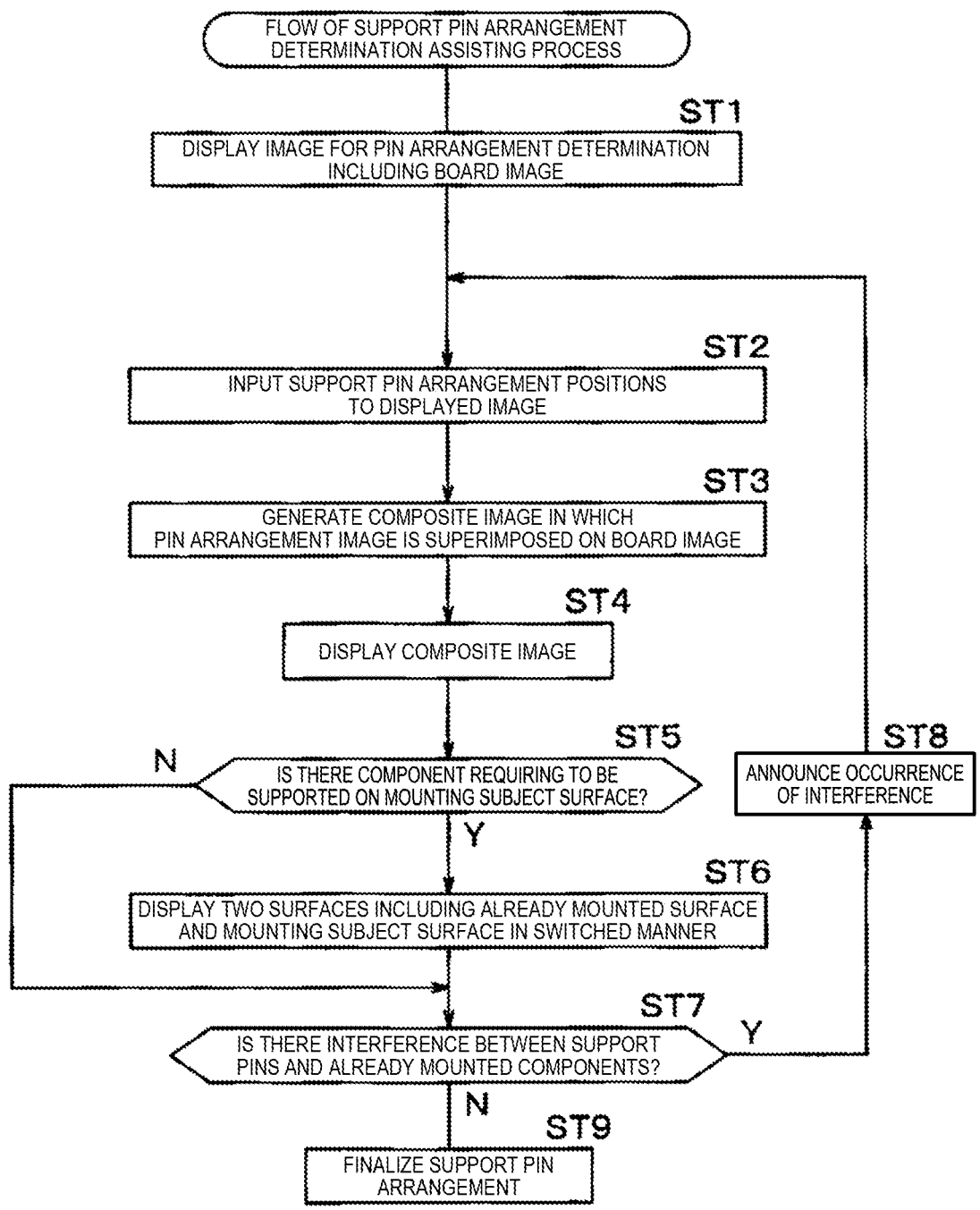
FIG. 12 is a flowchart of the support pin arrangement determination assisting method in the electronic component mounting machine according to the embodiment of the invention.

A support pin arrangement determination assisting method for assisting the determination of an arrangement of support pins using the support pin arrangement determination assisting apparatus having the above configuration will now be described with reference to the related drawings according to a flowchart of FIG. 12. As shown in FIG. 12, first, an image for pin arrangement determination including a board image is displayed on the display screen 35a (display step, ST1). More specifically, in a case in which a board 3 having an ordinary size is to be dealt with, a board image like the first surface 3a shown in FIG. 10A is displayed on the display screen 35a. In a case in which a board 3A is to be dealt with that needs to be subjected to mounting work plural times while being positioned successively at plural mounting work positions including at least a first mounting work position and a second mounting work position, a board image like the one shown in FIG. 11A is displayed on the display screen 35a.

Then arrangement positions SP of support pin modules 22 are input to the displayed image using the pointing function of the manipulation/input unit 36 (position input step, ST2). More specifically, as shown in FIGS. 10B and 11B, an operator selects and inputs arrangement positions SP1-SP5 that are suitable for supporting while observing the shapes and arrangement of already mounted components on the already mounted surface to be supported. In this example, the support pin modules 22 can be placed at any positions on the support base 21.

Then a composite image is generated in which a pin arrangement image indicating the arrangement positions SP is superimposed on the board image (ST3) and the generated composite image is displayed on the display screen 35a (pin image display processing step, ST4). The planar image of each support pin module 22 shown in this composite image includes the images of the absorption brim 25b and the contact portion 25a of the top portion 25 shown in FIGS. 9A-9C, which makes it possible to judges occurrence/non-occurrence of interference between the top portions 25 and the already mounted components on the composite image.

In a case in which the board 3A is to be dealt with, as shown in FIGS. 11B and 11C, a composite image produced by superimposing both of a first pin arrangement image and a second pin arrangement image on each board image is displayed. The first pin arrangement image is generated by inputting arrangement positions in a state that the board 3A is positioned at the first mounting work position. The second pin arrangement image is generated on the basis of the first pin arrangement image and the first mounting work position and the second mounting work position (the positioned positions of the board 3A) stored as the board position data 31d in advance with an assumption that the board 3A is positioned at the second mounting work position.

By referring to the board position data 31d, whether or not the mounting components of the mounting subject surface include a component that needs to be supported during a mounting operation is judged on the basis of the support necessity characteristics that are described in the data relating to the component characteristics that is included in the board position data 31d (ST5). If like the board 3 shown in FIGS. 10A-10C the mounting subject surface has a connector component Pd that needs to be supported because it will receive a pressing load during a mounting operation, the two surfaces, that is, the already mounted surface and the mounting subject surface, are displayed in a switched manner (ST6). Thus, switching is made from display as shown in FIG. 10B that is directed to the already mounted surface to display as shown in FIG. 10C that is directed to the mounting subject surface. The operator additionally inputs an arrangement position for the connector component Pd.

If no component that needs to be supported is found at step ST5 or step ST6 has been executed, occurrence/non-occurrence of interference between the support pins and the already mounted components is judged (interference judging step, ST7). More specifically, by referring to the component data 31b and the support pin data 31c, the interference judging unit 33 judges whether or not one or some of the support pin modules 22 of which arrangement positions have been input interfere with an already mounted component(s) on the basis of the three-dimensional shape data of the electronic components that is part of the component data 31b stored in advance and the three-dimensional shape data of the contact portion 25a of the support pin module 22 that is indicated by the support pin data 31c (see FIGS. 9A-9C).

If a judgment "occurrence of interference" is made at step ST7, the announcing means announces that fact in the form of, for example, display on the display device 35 (alarm step, ST8). The process returns to step ST2, in which the arrangement position concerned is corrected to eliminate the interference. Then a judgment "no interference" is made at step ST7, whereby the support pin arrangement is finalized (ST9). Thus, the support pin arrangement determination assisting process is finished.

As described above, in the support pin arrangement determination assistance according to the embodiment, in determining an arrangement of the support pin modules 22 for supporting an already mounted surface of a board 3 from the lower side in the board holding unit, the procedure is followed which includes displaying an image including a board image that indicates shapes and an arrangement of already mounted components on the already mounted surface, causing input of arrangement positions of the support pin modules 22 to the displayed image, and displaying a composite image in which a pin arrangement image indicating the input arrangement positions is superimposed on the board image. And a planar image of each support pin module 22 in the pin arrangement image includes an image of the top portion 25 and an image of the contact portion 25a for contacting and supporting the lower surface of the board 3. As a result, in support pin arrangement determining work for a high mounting density board 3, occurrence/non-occurrence of interference between the support pins and the already mounted components can be judged more precisely.

In the pin image display processing of displaying images including a first board image indicating an already mounted surface and a second board image indicating a mounting subject surface and displaying a composite image in which a pin arrangement image obtained by inputting arrangement positions of the support pin modules 22 to the displayed images is superimposed on a first board image or a second board image, a composite image based on the first board image and a composite image based on the second board image are displayed in a switched manner. This makes it possible to set a proper support pin arrangement in which an arrangement position of a component that exists on the mounting subject surface and needs to be supported is also taken into consideration.

Furthermore, in a case in which the subject board is a board 3A that is to be subjected to plural times of mounting work while being positioned successively at plural mounting work positions, a composite image is displayed that is produced by superimposing, on each board image, a first pin arrangement image of which arrangement positions have been input in a state that the board 3A is positioned at the first mounting work position and a second pin arrangement image generated on the basis of the first pin arrangement image with an assumption that the board 3A is positioned at the second mounting work position. This makes it possible to simplify the work of determining a common support pin arrangement for the plural mounting work positions.

The present application is based on Japanese Patent Application No. 2013-015079 and No. 2013-015080 both filed on Jan. 30, 2013 and No. 2013-016523 filed on Jan. 31, 2013, the disclosures of which are incorporated herein by reference.

INDUSTRIAL APPLICABILITY

The support pin arrangement determination assisting apparatus and the support pin arrangement determination assisting method according to the invention provide the advantage that occurrence/non-occurrence of interference between support pint and already mounted components can be judged more precisely in support pin arrangement work that is performed on a high mounting density board, and are useful in the field of electronic component mounting for mounting electronic components on a board that is supported by support pins.

DESCRIPTION OF REFERENCE SIGNS

1: Electronic Component Mounting Machine
2: Board Conveying Mechanism
2c: Board Support Mechanism
3, 3A: Board
8: Mounting Head
21: Support Base
22: Support Pin Module
23: Base Portion
24: Shaft
25: Top Portion
25a: Contact Portion
27: Magnet Member

What is claimed is:

1. A support pin arrangement determination assisting apparatus which assists determination of an arrangement of a support pin that supports a lower surface of a board, said lower surface opposing a component mounting surface of the board in a board holding unit of an electronic component mounting machine, the support pin arrangement determination assisting apparatus comprising:
 a display unit which displays an image including a board image, the board image indicating a shape and an arrangement of a component on the board;
 a position input unit through which an arrangement position of the support pin is input;
 a display processing unit which causes the display unit to display a figure to be superimposed on the board image, the figure corresponding to the support pin of which the arrangement position is input;
 a storage unit which stores three-dimensional shape data of an electronic component and three-dimensional shape data of the support pin;
 an interference judging unit which judges whether or not the support pin of which the arrangement position has been input interferes an already mounted component; and
 an alarm unit which announces occurrence of interference if the interference judging unit judges that there is the occurrence of interference,
 wherein the figure comprises a first figure and a second figure surrounding the first figure,
 wherein the first figure corresponds to a contact portion of the support pin, the contact portion contacting the lower surface of the board, and
 wherein the second figure corresponds to a top portion of the support pin, the top portion having a sectional shape larger than that of the contact portion.

2. The support pin arrangement determination assisting apparatus according to claim 1,
 wherein the position input unit comprises a pointing device, through which the arrangement position of the support pin is input on the board image.

3. The support pin arrangement determination assisting apparatus according to claim 1,
 wherein the display unit displays the board image based on data of the component.

4. The support pin arrangement determination assisting apparatus according to claim 1,
 wherein the first figure corresponds to a center of the support pin.

5. The support pin arrangement determination assisting apparatus according to claim 1,
 wherein the second figure corresponds to an outline of the support pin.

6. The support pin arrangement determination assisting apparatus according to claim 1, further comprising:
 a head which arranges the support pin in the board holding unit based on the arrangement position.

7. The support pin arrangement determination assisting apparatus according to claim 6,
 wherein the head comprises a support pin holding unit which holds the support pin, and
 wherein the head absorbs the support pin and arranges the support pin in the board holding unit.

8. The support pin arrangement determination assisting apparatus according to claim 1,
 wherein the board image indicates the shape and the arrangement of the component to be mounted on the component mounting surface.

9. The support pin arrangement determination assisting apparatus according to claim 1,
 wherein the board image indicates the shape and the arrangement of the component that is already mounted on the lower surface.

10. The support pin arrangement determination assisting apparatus according to claim 1,
 wherein the support pin comprises a base portion which contacts a support base provided in the board holding unit, and a magnet for fixing of the support pin is provided in the base portion.

11. The support pin arrangement determination assisting apparatus according to claim 1,
 wherein an outline portion and a central portion in a planar image of the support pin corresponds to an outer circumference of a top portion and the contact portion, respectively.

12. The support pin arrangement determination assisting apparatus according to claim 1,
 wherein the board image is created based on image data that is output at a designing stage.

13. The support pin arrangement determination assisting apparatus according to claim 1,
 wherein the board image includes a first board image indicating an already mounted surface and a second board image indicating a mounting subject surface on a support plate opposite to the first board.

14. A support pin arrangement determination assisting apparatus which assists determination of an arrangement of a support pin that supports a lower surface of a board, said lower surface opposing a component mounting surface of the board in a board holding unit of an electronic component mounting machine, the support pin arrangement determination assisting apparatus comprising:
 a display unit which displays an image including a board image, the board image indicating a shape and an arrangement of a component on the board;
 a position input unit through which an arrangement position of the support pin is input;
 a display processing unit which causes the display unit to display a figure to be superimposed on the board image, the figure corresponding to the support pin of which the arrangement position is input;
 a storage unit which stores three-dimensional shape data of an electronic component and three-dimensional shape data of the support pin;

an interference judging unit which judges whether or not the support pin of which arrangement position has been input interferes an already mounted component; and an alarm unit which announces occurrence of interference if the interference judging unit judges that there is the occurrence of interference, wherein the figure comprises a first figure and a second figure surrounding the first figure, and wherein the board image indicates the shape and the arrangement of the component that is already mounted on the lower surface.

15. The support pin arrangement determination assisting apparatus according to claim 14, wherein the first figure corresponds to a center of the support pin.

16. The support pin arrangement determination assisting apparatus according to claim 14, wherein the second figure corresponds to an outline of the support pin.

17. The support pin arrangement determination assisting apparatus according to claim 14, further comprising:

a head which arranges the support pin in the board holding unit based on the arrangement position.

18. The support pin arrangement determination assisting apparatus according to claim 17, wherein the head comprises a support pin holding unit which holds the support pin, and wherein the head absorbs the support pin and arranges the support pin in the board holding unit.

* * * * *